(12) United States Patent
Denning et al.

(10) Patent No.: US 9,330,889 B2
(45) Date of Patent: May 3, 2016

(54) PLASMA GENERATION DEVICE WITH MICROSTRIP RESONATOR

(71) Applicant: AGILENT TECHNOLOGIES, INC., Loveland, CO (US)

(72) Inventors: Mark Denning, San Jose, CA (US); Mehrnoosh Vahidpour, Santa Clara, CA (US)

(73) Assignee: Agilent Technologies Inc., Santa Clara, CA (US)

( * ) Notice: Subject to any disclaimer, the term of this patent is extended or adjusted under 35 U.S.C. 154(b) by 194 days.

(21) Appl. No.: 13/939,373

(22) Filed: Jul. 11, 2013

(65) Prior Publication Data

US 2015/0015140 A1    Jan. 15, 2015

(51) Int. Cl.
*H01J 7/46* (2006.01)
*H01J 37/32* (2006.01)
*H05H 1/46* (2006.01)

(52) U.S. Cl.
CPC ............ *H01J 37/32247* (2013.01); *H05H 1/46* (2013.01); *H05H 2001/4667* (2013.01)

(58) Field of Classification Search
None
See application file for complete search history.

(56) References Cited

U.S. PATENT DOCUMENTS

| | | | | |
|---|---|---|---|---|
| 5,406,238 A * | 4/1995 | Suzuki | ............... | H01P 7/082 333/219 |
| 6,211,754 B1 * | 4/2001 | Nishida | ............... | H03B 5/1852 331/107 SL |
| 6,225,879 B1 * | 5/2001 | Schallner | ............... | H01P 7/082 333/205 |
| 6,653,914 B2 * | 11/2003 | Gapski | ............... | H01P 7/084 333/204 |
| 6,917,165 B2 * | 7/2005 | Hopwood | ............... | H05H 1/46 118/723 MP |
| 7,309,842 B1 * | 12/2007 | Doughty | ............... | G01J 3/443 118/723 E |
| 7,915,979 B2 * | 3/2011 | Chang | ............... | H01P 1/2039 333/205 |
| 2007/0170995 A1 * | 7/2007 | Dutton | ............... | H05H 1/46 331/107 R |
| 2007/0170996 A1 * | 7/2007 | Dutton | ............... | H01J 37/32192 331/126 |
| 2010/0194278 A1 * | 8/2010 | Ouyang | ............... | H01J 37/32366 315/111.21 |

(Continued)

FOREIGN PATENT DOCUMENTS

WO    WO2004062326    7/2004
WO    WO2010129277    11/2010

OTHER PUBLICATIONS

A. M. Bilgic, U. Engel, E. Voges, M. Kiickelheim, and J. A. C. Broekaert, "A new low-power microwave plasma source using microstrip technology for atomic emission spectrometry," Plasma Sources Sci. Technol., vol. 9, No. 1, pp. 1-4, Feb. 2000.

(Continued)

*Primary Examiner* — Tung X Le
*Assistant Examiner* — Srinivas Sathiraju (57) ABSTRACT

A plasma generation device, a system including a plasma generation device, and a method of generating plasma and vacuum UV (VUV) photons are described. In a representative embodiment, plasma generation device, includes: a substrate having a first surface and a second surface; a resonant ring-shaped structure disposed over the first surface of the substrate, the resonant ring-shaped structure having dimensions selected to support at least one standing wave having more than one electric field maximum along a length of the resonant ring-shaped structure; a ground plane disposed on the second surface of the substrate; and an apparatus configured to provide a gas at locations of the electric field maxima.

20 Claims, 6 Drawing Sheets

(56) References Cited

U.S. PATENT DOCUMENTS

| | | | |
|---|---|---|---|
| 2010/0327155 A1* | 12/2010 | Lopez-Avila | G01N 27/622 250/282 |
| 2011/0175531 A1* | 7/2011 | Urdahl | H05H 1/24 315/111.21 |
| 2011/0180699 A1 | 7/2011 | Cooley et al. | |
| 2012/0045863 A1* | 2/2012 | Hopwood | C23C 16/24 438/57 |
| 2014/0049259 A1* | 2/2014 | Poon | G01R 33/34092 324/322 |
| 2014/0159571 A1* | 6/2014 | Hopwood | H05H 1/2406 315/39 |

OTHER PUBLICATIONS

C. Wu, Z.-B. Zhang, A. Hoskinson, and J. Hopwood, "Circular array of stable atmospheric pressure microplasmas," Eur. Phys. J. D, vol. 60, No. 3, pp. 621-625, Aug. 2010.

A. R. Hoskinson and J. Hopwood, "A two-dimensional array of microplasmas generated using microwave resonators," Plasma Sources Sci. Technol., vol. 21, No. 5, p. 052002, Oct. 2012.

Extended European Search Report mailed Nov. 10, 2014 in Application No. 14171335.4.

* cited by examiner

PLASMA GENERATION DEVICE WITH MICROSTRIP RESONATOR

BACKGROUND

A plasma is a gaseous collection of ions, neutral atoms or molecules, and free electrons. Plasmas are electrically conductive because the unbound charged particles couple easily to electromagnetic fields. While the definition of the term "plasma" can vary, it usually includes some element of "collective" behavior, meaning that any one charged particle can interact with a large number of other charged particles in the plasma.

Plasma can be used as a light source in mass spectrometry applications, For example, a microplasma photoionization (MPPI) source can be used in mass spectrometers to provide ultraviolet (UV) light to (photo) ionize analyte molecules. Photoionization can be achieved using plasma-based lamps in which light is produced as a result of the excitation of rare gas atoms. The emitted UV light can be at a variety of wavelengths based on the gas composition.

There is a need to increase the power of the emitted radiation from plasma UV sources. A saturation limit is often reached using a single RF/microwave plasma source; increasing the RF power realizes a diminished return in output UV radiation power. While it is possible to provide RF/microwave power to multiple plasma generation devices to provide increased UV output, other drawbacks make this option unattractive. For example, multiple sources and multiple feeds are required, resulting in a more complex and comparatively expensive UV source, Moreover, the resonance frequency of each component is not necessarily tuned to the frequency of the input RF/microwave power source. Because each component may have a different resonance frequency, each component will require its own designated RF/microwave power source, and multiple connections will be required. This would result in a more complex structure to realize a more powerful UV output from the MPPI. This complexity adds to the cost and size of the MPPI.

What is needed, therefore, is a plasma generation device that overcomes at least the deficiencies and drawbacks of the known UV light sources described above.

BRIEF DESCRIPTION OF THE DRAWINGS

The representative embodiments described below are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. Descriptions of known devices, materials and manufacturing methods may be omitted so as to avoid obscuring the description of the example embodiments. Nonetheless, such devices, materials and methods that are within the purview of one of ordinary skill in the art may be used in accordance with the representative embodiments. Further, it is understood that the various configurations of electrical components and connections depicted in the figures are illustrative, and therefore may vary without departing from the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms 'a', 'an' and 'the' include both singular and plural referents, unless the context clearly dictates otherwise, Thus, for example, 'a device' includes one device and plural devices. The terms 'substantial' or 'substantially' mean to within acceptable limits or degree. The term 'approximately' means to within an acceptable limit or amount to one of ordinary skill in the art.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example. if the device were inverted with respect to the view in the drawings, an element described as "above" another element, for example, would now be below that element.

Generally, and as described, below in connection with representative embodiments, the present teachings are directed to a plasma generation device, a system comprising a plasma generation device, and a method of generating plasma and vacuum UV (VUV) photons. In a representative embodiment, the plasma generation device comprises: a substrate having a first surface and a second, surface; a resonant ring-shaped structure disposed over the first surface of the substrate, the resonant ring-shaped structure having dimensions selected to support at least one standing wave having more than one electric field maximum along a length of the resonant ring-shaped structure; a ground plane disposed on the second surface of the substrate; and an apparatus configured to provide a gas at locations of the electric field maxima.

As will be appreciated from a review of the present disclosure, the resonant ring-shaped structures and, resonant rings of the representative embodiments are "closed loop" structures (circular, elliptical, rectangular, etc., as described below) configured to establish one or more standing waves with more than one electric field maximum thereon. Among other distinctions, the resonant ring-shaped structures and resonant rings of the representative embodiments differ from other known devices that are either open-loop resonators e.g., split-ring resonators), linear arrays of such resonators with gaps, or linear microstrip resonators.

Among other applications, the plasma generation device, system and method are contemplated for use in gas chromatography (GC)-mass spectrometry (MS) applications. As can be appreciated by one of ordinary skill in the art, it is desirable to achieve the highest possible fraction of ionized molecules for GC-MS applications. The plasma generation device, systems and methods of the present teachings foster more complete ionization of analytes. Notably, the fraction of analyte molecules ionized in passing through a region of VFW radiation can be expressed as $\eta_{PI} \approx \sigma_{PI} h_v T_i$, where $\eta_{PI}$ is the photoionization fraction, $\sigma_{PI}$ is the photoionization cross-section, $T_i$ is the average residence time of the molecules in the ionization zone, and $I_{hv}$ is the VUV light intensity. Since $\sigma_{PI}$ is a fixed inherent property of a given molecule and $T_i$ is mainly determined by the column flow rate which typically varies over a narrow range of values, it is necessary to provide a higher VUV intensity ($I_{hv}$) to realize higher ionization fractions. The plasma generation device of a representative embodiment provides a single, plasma device with multiple light sources. Beneficially, the plasma generation device of the present teachings provides a comparatively higher level of VUV light intensity in the photoionization region and requires only a single microwave source to feed the plasma generation device. Moreover, microwave power is dissipated over a comparatively larger area/volume so higher microwave input power can be used.

Figure 1:
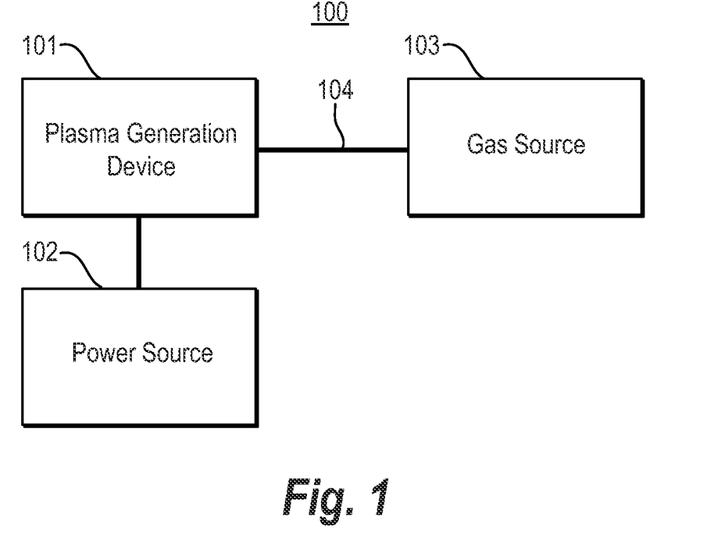
FIG. 1 is a simplified schematic block diagram of a system comprising a plasma generation device in accordance with a representative embodiment.

FIG. 1 is a simplified schematic block diagram of a system 100 comprising a plasma generation device 101. Illustratively, the plasma generation device 101 comprises a plasma generation device described in connection with representative embodiments below. The system 100 also comprises a power source 102, which is illustratively an RF/microwave power source. The power source 102 provides electromagnetic radiation having a frequency substantially equal to the resonance frequency of the resonant ring-shaped structure or resonant ring of the plasma generation device 101. By way of example, the power source provides electromagnetic radiation having between approximately 1 W and approximately 50 W, with a frequency between approximately 1 GHz and approximately 20 GHz.

The system 100 also comprises a gas source 103 that provides a gas for striking plasma in the plasma generation device 101. The gas from the gas source 103 is provided to the plasma generation device 101 by a gas feed line 104. While a variety of gases are contemplated, generally, the gas provided from the gas source is a noble gas such as argon (Ar) or helium (He). The gas chosen can be delivered in a flowing configuration where there is a constant replenishment of the gas as it flaws out of the system, or in a static fill configuration, in which the gas is delivered either to the individual plasma confinement structures and then sealed therein, or provided as an ambient gas inside a larger sealed. container within which the plasma generation device resides.

Figure 2:
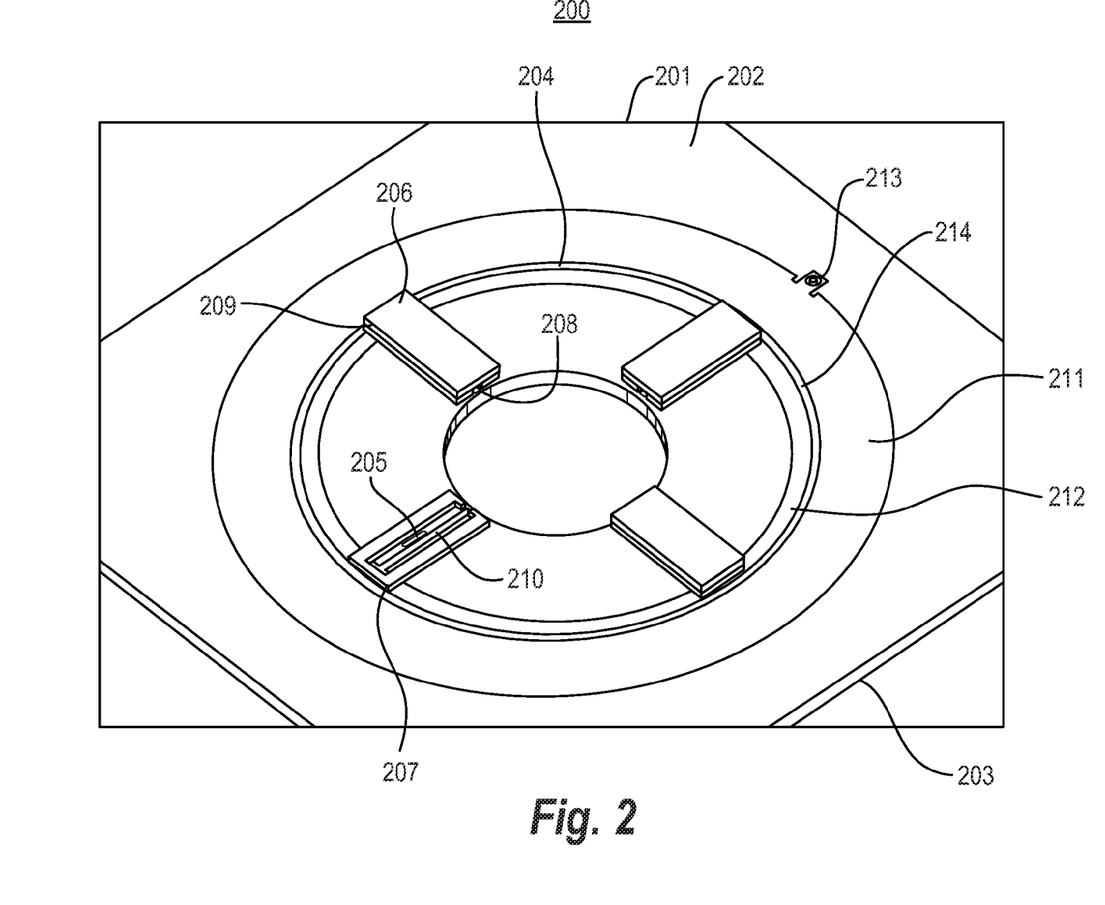
FIG. 2 is a perspective view of a plasma generation device in accordance with a representative embodiment.

FIG. 2 shows a perspective view of a plasma generation device 200 in accordance with a representative embodiment. The plasma generation device 200 comprises a substrate 201 having a first surface 202 and a second surface 203, which opposes the first surface 202. A resonant ring-shaped structure 204 is disposed over the first surface 202 of the substrate 201, and a ground plane (not shown) is provided over the second surface 203 of the substrate 201. As described more fully below, the resonant ring-shaped structure 204 has dimensions selected to support at least one standing wave having more than one electric field maximum along its circumference.

The plasma generation device 200 also comprises an opening 205 that connects to a source of gas (not shown), with the opening 205 configured to provide a gas (e.g., a noble gas) at locations of the electric field maxima. In the presently described representative embodiment, there are four electric field maxima. located along the circumference of the resonant field-shaped structure 204, and as such, there are four openings configured to provide gas. It is emphasized that striking of four plasmas as in the presently described representative embodiments is merely illustrative, and the striking of more or fewer than four plasmas is effected by extension of the teachings of the representative embodiments.

A plurality of structures 206 is provided over the respective locations of the electric field maxima, The structures 206 each comprise a base 207 and a cover 209 disposed over the base 207. Notably, the base 207 can only be completely seen in one of the four structures, where the cover 209 has been removed for ease of description. As can be appreciated by one of ordinary skill in the art, the structures 206 can be made of a material that is substantially transparent to the emission wavelength range (e.g., VUV) of the plasma generated therein. However, this is not essential. Rather the structures 206 can be made of a material that is not transparent to UV light. For example, the UV light can be transmitted from the plasma either through an open hole 208 in the structure 206 or through a UV-transparent window (not shown) in the structure 206. The holes 208 are illustratively oriented radially inward from each structure 206, so that the light from each plasma contributes to the total intensity in the center of the plasma generation device 200. The size of the hole 208, the flow rate of the gas fed in through the opening in the substrate 201, and the ambient pressure dictate the pressure inside the structures, which can be optimized for maximum UV output. For the case of using a UV-transparent window, UV transparent materials generally will be either calcium fluoride or magnesium fluoride.

While a plurality of structures 206 are provided with corresponding openings 205 that each connect to a source of gas (not shown) at locations of the electric field maxima, it is not essential that a plasma be struck at each structure 206. Specifically, it may be useful to strike a plasma at fewer than the total number of structures 206, and the present teachings contemplate striking a plasma at only one of the structures 206. This may be effected by not providing gas to all (in the representative embodiment, all four) structures 206, but only as many as there are plasmas desired. Alternatively, in the interest of efficiency, the resonant ring-shaped structure 204 may be selected to excite a mode having one standing wave with two electric field maxima. The structure 206 with opening 205 for providing gas to strike the plasma is disposed near one of the electric field maxima. This way only one electric field maximum will not be used to strike a plasma, reducing loss and increasing the efficiency of the plasma generation device 200.

Among other functions, the structures 206 confine the gas from the gas source (not shown) from which plasma is generated. This confinement of the gas allows the pressure of the gas to achieve a desired pressure to ignite the plasma. Moreover, the confinement of the plasma provided by the structure 206 results in a comparatively high electron temperature, which enhances the excitation of the noble gas atoms that generate the desired VUV radiation from the plasma. Finally, in the depicted representative embodiment, the structures 206 are provided on the "inward" side of the resonant ring-shaped structure 204. As such, plasma is generated in multiple locations in a comparatively small volume, thereby providing VUV radiation of significant power in a comparatively small volume. In certain embodiments of plasma generation device 200, substrate 201 is a dielectric material that has a comparatively high dielectric constant. By comparatively high dielectric constant is meant a dielectric constant that is 2 or higher, such as 5 or higher, including 9.6 (e.g., ceramic) or higher. In other embodiments, there are no constraints on choosing the material for the substrate 201 from the standpoint of dielectric constant, so it does not need to be high. Generally, the substrate 201 is made of a material that is comparatively low loss at frequencies of operation.

Dielectric materials that find use as substrate 201 include, but are not limited to, ceramic compounds, TEFLON® (Polytetrafluoroethylene (PTFE)), polymers, glass, quartz and combinations thereof in certain embodiments substrate 201 is fabricated from a single material whereas in certain other embodiments the substrate contains more than one material, e.g., different layers of distinct materials, The dimensions of substrate 201 can vary widely depending on the intended use of the plasma generated by plasma generation device 200 and/or the nature of the dimensions of resonant ring-shaped structure 204, which are a function of the substrate dielectric properties, the frequency of operation and the required characteristic impedance. In certain embodiments, substrate 201 is a planar substrate and has a length ranging from about 5 mm to about 100 mm, such as from about 10 mm to about 70 mm and including from about 20 mm (actual ceramic) to about 50 mm (actual RT/DUROID®); a width ranging from about 5 mm to about 100 mm, such as from about 10 mm to about 70 mm and including from about 12 mm (actual ceramic) to about 40 mm (actual RT/DUROID®) and a thickness ranging from about 100 µm to about 5 mm, such as from about 100 µm to about 2 mm and including from about 1 mm (actual ceramic) to about 2 mm.

In a representative embodiment, an electrode extension 210 that is part of the resonant ring-shaped structure 204 is provided at locations of the electric field maxima. The respective openings 205 are provided adjacent to respective electrode extensions 210. The electrode extensions have a length substantially the same as the length of its respective structure 206. Notably, the resonant ring-shaped structure 204 and electrode extensions 210 are designed to ensure the electric field pattern is proper, and the structure is substantially impedance-matched. Once this is complete the locations of the openings 205 are determined. to optimize efficient plasma generation.

As described more fully below, the electrode extensions 210 serve to locate the electric field maxima of the standing wave supported by the resonant ring-shaped structure 204 near the opening 205 and therefore, near the gas provided for plasma generation. As such, the electrode extensions 210 foster plasma generation in each of the structures 206, resulting in a plurality (in this example four) sources of plasma VUV radiation from the plasma generation device 200. The electrode extensions 210 are optional, and as described. below, the plasma generation device 200 can generate plasma in the regions of electric field maxima without the electrode extensions 210. Notably, however, when electrode extensions 210 are not implemented, the plasma generated in each structure 206 will be confined to a smaller volume and will not have the length that is realized through the use of electrode extensions.

In accordance with the representative embodiment described in connection with FIG. 2, the resonant ring-shaped structure 204 comprises a first ring 211 concentric with a second ring 212, a gap 214 therebetween, and electrode extensions 210 extending inward from the second ring 212. The first ring 211 is connected via a connection 213 to the RF/microwave power source (not shown), and is coupled to the second ring 212 that is separated from the first ring 211 by the gap 214. In the representative embodiments, the first and second rings 211, 212 are microstrip transmission lines, with a ground plane provided over the second surface 203 opposing the first surface 202, over which the first and second rings 211, 212 are formed.

In the embodiments described herein, the resonant ring-shaped structure 204, the first ring 211 and the second ring 212 are substantially circular. This is merely illustrative, and it is emphasized that the resonant ring-shaped structure 204, the first ring 211 and the second ring 212 can take a variety of shapes. Thus, the terms "ring" and "ring-shaped" are not to be limited to only circular rings but is intended to refer to any circular or non-circular shaped structure, where first and second rings 211, 212 of interest include, but are not limited to: circular, elliptical or oval and other non-circular rings, and rectangular or other multisided shapes. Resonant ring-shaped structure 204 can be disposed over the substrate 201 in a variety of ways, In certain embodiments, substrate 201 is coated with material for the microstrip layer (e.g., Au, Cu, etc.) and resonant ring-shaped structure 204 is formed by photo-lithographic and wet etching techniques, which themselves are known in the art. Other processing techniques that are within the purview of one of ordinary skill in the art can be used to form resonant ring-shaped structure 204 and electrode extensions 210 over substrate 201. For example, printed circuit board (PCB) milling techniques could be used.

As alluded to above, the dimensions (e.g., circumference) of the resonant ring-shaped structure 204 are selected so that the resonant ring-shaped structure 204 is substantially impedance-matched to the input impedance of the RF/microwave power source at a desired resonance condition. Moreover, the lengths of the electrode extensions 210 are substantially equal to the length of the respective structures 206 and are optimized for the specific gas pressure (and other parameters related to plasma behavior). More generally, the length of the electrode extensions 210 can be a variable as well. By "matched" is meant that the impedance that is presented at connection 213 is equivalent to the output impedance of a RF/microwave power source such that maximum power transfer can be obtained. Any difference in these two impedances can result in a reflected component of power at connection 213 back towards RF/microwave power source (not shown). Moreover, and as noted above, the resonant ring-shaped structure 204 has dimensions (in particular a circumference) that are selected to support at least one standing wave haying more than one electric field maximum along the length (circumference) of the resonant ring-shaped structure 204. In representative embodiments, the circumference of resonant ring-shaped structure 204 is approximately a multiple of one-half wavelength ($\lambda/2$) at the operating frequency of plasma generation device 200.

Notably, gap 214 impacts the coupling between the first and second rings 211, 212, Generally, as would be appreciated by one of ordinary skill in the art, various parameters are beneficial to provide a desired resonance at the center frequency of the RF/microwave power source (not shown in FIG. 2), the desired E-field distribution and the highest possible electric field magnitude on top of the electrodes.

The two concentric ring structure of the resonant ring-shaped structure 204 is provided to facilitate the impedance matching of the resonant ring-shaped structure 204 to the RF/microwave power source. To this end, the resonance frequency supported. by the resonant ring-shaped structure 204 is governed by the dimensions (e.g., lengths/circumferences and widths) of the first ring 211, the second ring 212, the gap 214, and the electrode extensions 210. Impedance matching of the resonant ring-shaped structure 204 to the RF/microwave power source by alteration of the lengths/circumferences and widths of the first ring 211, the second ring 212, or by alteration of the lengths and widths of the electrode extensions 210, can result in a change in the resonance frequency of the waveguide. In addition, the loaded impedance of the plasma generated in the structures 206 can result in an impedance mismatch. So, a change in the resonance frequency would require a change in the frequency of the RF/microwave power source to ensure that resonance conditions are met in the resonant ring-shaped structure 204 so that one or more standing waves with more than one electric field maximum are established along the length/circumference of the second ring 112. While other tuning elements (e.g., stub tuners) known to one of ordinary skill in the art may be used to effect impedance matching, the use of the coupled resonantor ring arrangement of the representative embodiments provides a comparatively straight-forward solution.

In a representative embodiment, the length/circumference and width of the first ring 211 are selected, and can be altered, to ensure impedance matching of the resonant ring-shaped structure 204 to the RF/microwave power source. The first ring 211 is coupled through microstrip coupling to the second ring 212, and as a result at least one standing wave with more than one electric field maximum is supported by the first and second rings, 211, 212. Because the power from the U/microwave power source to the second ring 212 is provided through coupling to the first ring 211, the RF power is fed in parallel to multiple plasmas and beneficially prevents saturation of UV emission experienced by the use of single plasma operated with the same amount of power. Notably, there is a maximum amount of UV light that can be produced by a single plasma at an optimum power level. Above that power level the UV emission does not substantially increase. Therefore, for example in the presently described representative embodiments, having four plasmas (from four structures 206) operating at this optimal power level will yield nearly four times as much light as a single plasma run at four times the optimum power level.

In operation, gas (e.g., a noble gas) from gas supply (not shown in FIG. 2) is provided to each of the openings 205, which are located near the electric field maxima, The gas may be flowed into the structures 206 no that a plasma is generated in the structures 206.

Figure 3:
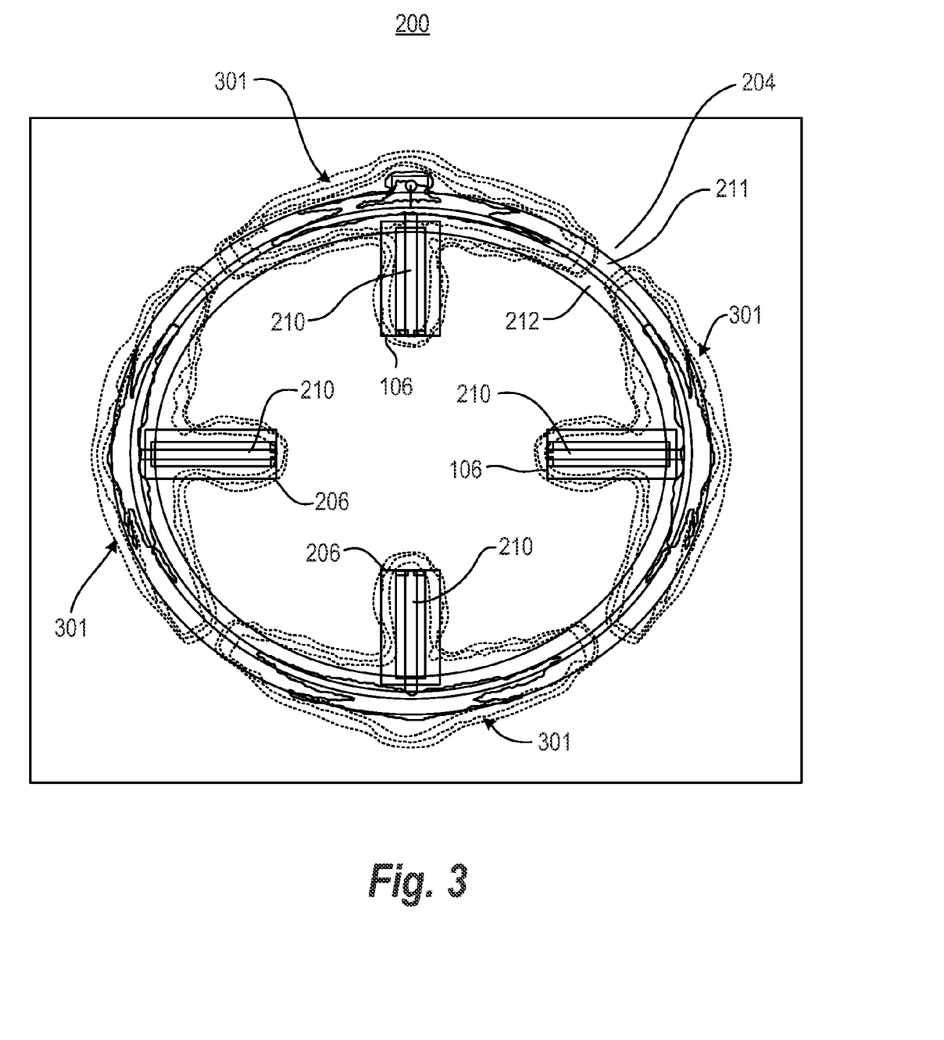
FIG. 3 is a top view showing electric field intensities of a standing wave at resonance along a resonant ring in accordance with a representative embodiment.

FIG. 3 is a top view of plasma generation device 300 of a representative embodiment, and shows electric field intensities of a standing wave at resonance along a resonant ring-shaped structure 204 in accordance with a representative embodiment, Regions 301 depict electric field maxima of the standing wave supported by the resonant ring-shaped structure 204. As can be appreciated, structures 206 are disposed near or over the regions of electric field maxima of the standing wave(s), and provide a path for conduction so that within structures 206 sufficient energy is provided to ensure striking and maintaining a plasma in each of the structures 206. Beneficially, the plasma generation device 100 generates plasma in multiple locations in a comparatively small volume, thereby providing VUV radiation of significant power in a comparatively small volume. Electrode extensions 210 serve to maintain a plasma with an extended linear shape, which has been observed to emit more UV radiation along the axis of this linear extension than a more compact plasma operated under the same conditions.

Notably, the plasma generation device 100 operates very differently with and without plasma, and must perform two separate functions. The first is to provide a sufficiently intense electric field somewhere within the confinement structures 206 to strike a plasma. This function requires resonance, once the plasma is formed, the electrode extensions 210 now perform a different function, which is to deliver power to the plasma in a preferred volume (such as along the length of the electrode extensions 210). Once the plasma is operating, it is not really the field intensity that is critical to operation, hut rather how much electromagnetic power is delivered to the electrons of the plasma and where this power is delivered spatially. Since the electric field structure even in the presence of the plasma is still peaked under the structures, this helps deliver the power to the center of the structure which is desirable for efficient plasma production and directed UV emission.

Figure 4A:
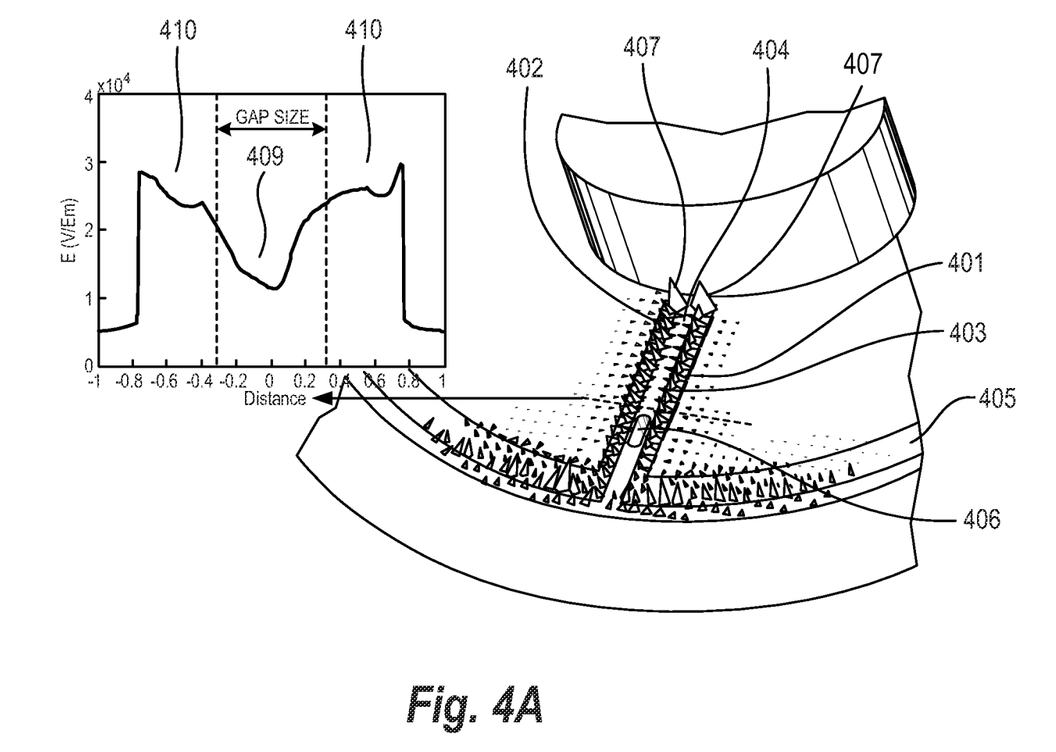
FIG. 4A shows the electric field lines and magnitude in a region near an electrode extension in accordance with a representative embodiment.

FIG. 4A shows the electric field lines and magnitude in a region near an electrode extension 401 in accordance with a representative embodiment. Electrode extension 401 is contemplated for use in the plasma generation device 100 described above. Many aspects of the plasma generation device 100 are common to the description of FIG. 4A and. are not repeated to avoid obscuring the present description.

The electrode extension 401 has a first electrode 402 and second electrode 403 that are separated by a gap 404 in the microstrip transmission line 405, which forms the second ring. The opening 406 provides a gas for the generation of a plasma, and structure 206 (not shown in FIG. 4A) is provided over the opening and centered on the gap 404. As described above in connection with representative embodiments, the electrode extension 401 is provided at or near an electric field maximum of the standing wave(s) supported by the microstrip transmission line 405.

Since the structure of the plasma generation device 100 is substantially symmetric, there is no electrical potential difference across the gap 404 so the electrodes are equipotential and the electric field is vertically oriented at the first and second electrodes 402, 403. As can be appreciated from a review of FIG. 4A, the orientation of the electric field lines 407 results in an electric field minimum 409 at a point above the gap 404, and electric field maxima 410 as the distance from the center of the gap 404 increases. Thus, locating structures 206 (not shown in FIG. 4A) over the electrode extension 401 would result in an undesirably low electric field strength in the center of the structure 206, and comparatively high electric field strength near the sides of the structures 206. As will be appreciated by one of ordinary skill in the art, it is undesirable to have a comparatively high-magnitude electric field near the outer portion (sides) of the interior of the structures 206 because plasma recombination generally occurs on the walls of the containment structure, so that power delivered to the plasma here results in a plasma of lower density and less production of UV photons. Additionally if the goal of plasma production is to produce UV photons directed out of a containment structure through a centered orifice, it is desirable for those photons to be produced in the center to minimize the shadowing of the photons by the walls of the structure.

Figure 4B:
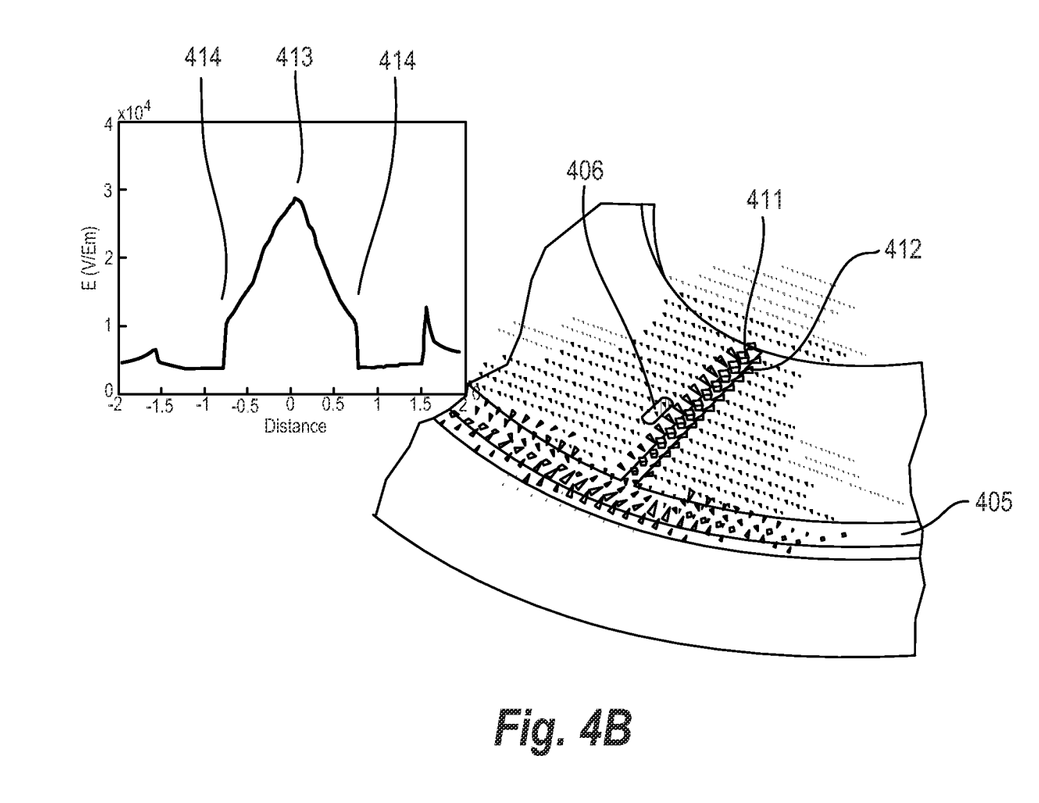
FIG. 4B shows the electric field lines and magnitude in a region near an electrode extension in accordance with a representative embodiment.

FIG. 4B shows the electric field lines and magnitude in a region near an electrode extension 411 in accordance with a representative embodiment. Electrode extension 411 is contemplated for use in the plasma generation device 100 described above. Many aspects of the plasma generation device 100 are common to the description of FIG. 4B and are not repeated to avoid obscuring the present description.

The electrode extension 411 is a single electrode structure electrically connected to the microstrip transmission line 405, which forms the second ring. The opening 406 provides a gas for the generation of a plasma, and a structure 206 (not shown) is provided over the opening and centered over the electrode extension 411. As described above, the electrode extension 401 is provided at or near an electric field maximum of the standing wave(s) supported by the microstrip transmission line 405.

The electric field is vertically oriented near the electrode extension, and the orientation of the electric field lines 412 results in an electric field maximum 413 at a point above the electrode extension 411, and electric field minima 414 as the distance from the center of the electrode extension 411 increases. Thus, locating structures 206 (not shown in FIG. 4B) over the electrode extension 411 would result in a desirably high electric field strength in the center of the structure 206, and comparatively low electric field strength near the sides of the structures 206. As will be appreciated by one of ordinary skill in the art, it is desirable to provide a maximum electric field magnitude in the region where plasma is desirably formed (i.e., near the center of the structure 206) and a minimum electric field magnitude at the outer portion (sides) of the structures 206, as described above.

Figure 5:
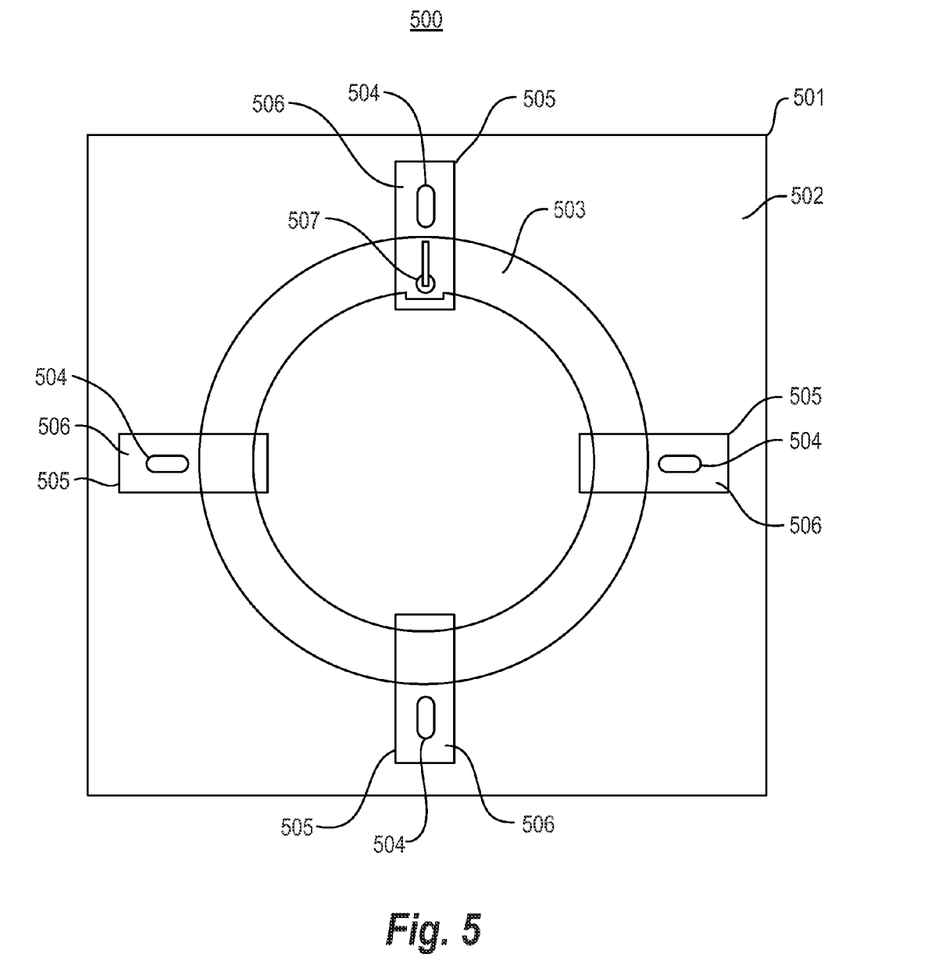
FIG. 5 is a top view of a plasma generation device in accordance with a representative embodiment.

FIG. 5 is a top view of a plasma generation device 500 in accordance with a representative embodiment. Many aspects of the plasma generation device 100 are common to the description of plasma generation device 500 of the presently described embodiments, and are not repeated to avoid obscuring the present description.

The plasma generation device 500 comprises a substrate 501 having a first surface 502 and second surface (not shown), which opposes the first surface 502. A resonant ring 503 is disposed over the first surface 502 of the substrate 501, and a ground plane (not shown) is provided over the second surface of the substrate 501. As described more fully below, the resonant ring 503 has a length (in this case circumference) selected to support at least one standing wave having more than one electric field maximum along the length of the resonant ring.

The plasma generation device 500 also comprises openings 504 that are connected to a source of gas (not shown), with the opening configured to provide a gas (e.g., a noble gas) at locations of the electric field maxima. In the presently described, representative embodiment, there are four electric field maxima located along the circumference of the resonant ring 503, and as such, there are four openings 504 configured to provide gas. A plurality of structures 505 is provided over the respective locations of the electric field maxima, Each structure comprises a base (not shown) and a cover 506 disposed over the base.

Among other functions, the structures 505 confine the gas from the gas source (not shown) from which plasma is generated. This confinement of the gas allows the pressure of the gas to achieve a desired pressure to ignite the plasma. Moreover, the confinement of the gas provided by the structure 505 results in a comparatively high electron temperature, which enhances the excitation of the noble gas atoms that generate the desired VUV radiation from the plasma. Finally, in the depicted representative embodiment, the structures 505 are provided on the resonant ring 503. As such, plasma is generated in multiple locations in a comparatively small volume, thereby providing the VUV radiation of significant power in a comparatively small volume.

In certain embodiments of plasma generation device 500, substrate 501 is a dielectric material that has a comparatively high dielectric constant. By comparatively high dielectric constant is meant a dielectric constant that is 2 or higher, such as 5 or higher, including 9.6 (e.g., ceramic) or higher. Dielectric materials that find use as substrate 501 include, but are not limited to, ceramic compounds, TEFLON® (Polytetrafluoroethylene (PTFE)), polymers, glass, quartz and combinations thereof. In certain embodiments substrate 501 is fabricated from a single material whereas in certain other embodiments the substrate contains more than one material, e.g., different layers of distinct materials. The dimensions of substrate 501 can vary widely depending on the intended use of the plasma generated by plasma generation device 500 and/or the nature of the dimensions of resonant ring 503, which are a function of the substrate dielectric properties, the frequency of operation and the required characteristic impedance. In certain embodiments, substrate 501 is a planar substrate and has a length ranging from about 5 mm to about 100 mm, such as from about 10 mm to about 70 mm and including from about 20 mm (actual ceramic) to about 50 mm (actual RT/DUROID®); a width ranging from about 5 mm to about 100 mm, such as from about 10 mm to about 70 mm and including from about 12 mm (actual ceramic) to about 40 mm (actual RT/DUROID®) and a thickness ranging from about 100 μm to about 5 mm, such as from about 100 μm to about 2 mm and including from about 1 mm (actual ceramic) to about 2 mm.

In accordance with the representative embodiment described in connection with FIG. 5, the resonant ring 503 is a single microstrip transmission line that is connected via a connection 507 to the RF/microwave power source (not shown).

In the embodiments described herein, the resonant ring 503 is substantially circular. This is merely illustrative, and it is emphasized that the resonant ring 503, can take a variety of shapes. Thus, the term "ring" is not to be limited to only a circular ring but is intended to refer to any circular or non-circular shaped structure, where the shape of the resonant ring 503 of interest can be, but is not limited to: a circular, elliptical or oval or other non-circular shape, or rectangular or other multisided shapes. Resonant ring 503 can be disposed over the substrate 501 in a variety of ways. In certain embodiments, substrate 501 is coated with material for the microstrip layer (e.g., Au, Cu, etc.) and resonant ring 503 is formed by photo-lithographic and wet etching techniques which themselves are known in the art. Other processing techniques that are within the purview of one of ordinary skill in the art can be used to form resonant ring 503 and over substrate 501.

The dimensions of the resonant ring 503 are selected so that the resonant ring 503 is substantially impedance-matched to the input impedance of the RF/microwave power source at a desired resonance condition. By "matched" is meant that the impedance that is presented at connection 507 is equivalent to the output impedance of a RF/microwave power source such that maximum power transfer can be obtained. Any difference in these two impedances can result in a reflected component of power at connection 507 back towards RF/microwave. power source (not shown in FIG. 5). Moreover, and as noted above, the resonant 503 has a length/circumference that is selected to support at least one standing wave having more than one electric field maximum along the length/circumference of the resonant ring 503. In representative embodiments, the circumference of resonant ring 503 is approximately a multiple of one-half wavelength ($\lambda/2$) at the operating frequency of plasma generation device 500.

Impedance matching of the resonant ring 503 to the RF/microwave power source can be effected by alteration of the dimensions (e.g., length/circumference and width) of the resonant ring 503. In addition, the loaded impedance of the plasma generated in the structures 505 can result in an impedance mismatch, and must be accounted for in impedance matching. Other tuning elements (e.g., stub tuners) known to one of ordinary skill in the art may be used to effect impedance matching.

In a representative embodiment, the dimensions the length/circumference and width) of the resonant ring 503 are selected, and can be altered, to ensure impedance matching of the resonant ring 503 to the RF/microwave power source. In operation, gas (e.g., a noble gas) from gas supply (not shown) is provided to each of the openings 504, which are located near the electric field maxima, The gas may be flowed into the structures 505 so that a plasma is generated in the structures 505.

Figure 6:
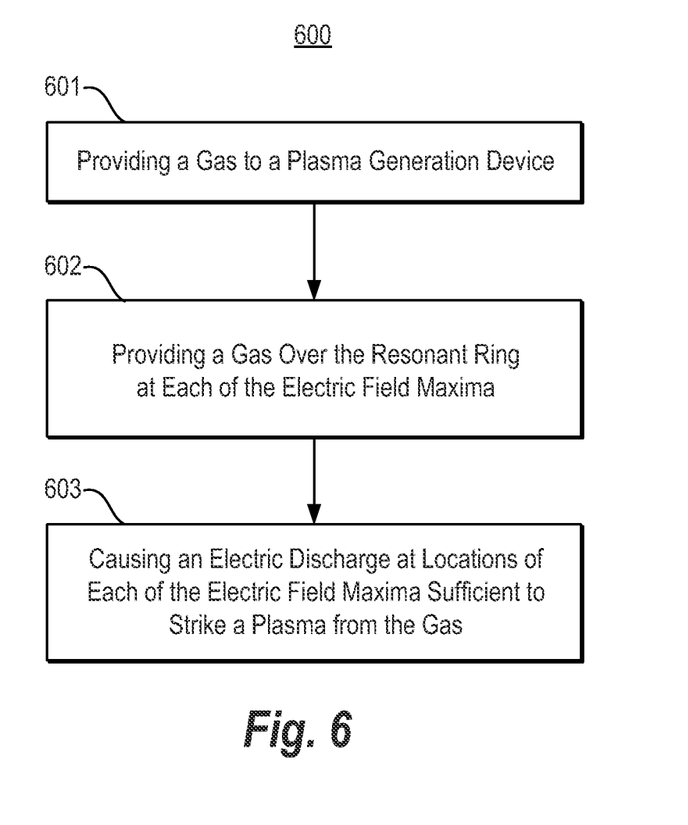
FIG. 6 is a flow chart of a method in accordance with a representative embodiment.

FIG. 6 is a flow chart of a method 600 in accordance with a representative embodiment. The method 600 may be implemented in the system 100 described above, using a plasma generation device in accordance with a representative embodiment. At 601, the method comprises providing a gas to a plasma generation device. As described above, the plasma generation device comprises: a substrate having a first surface and a second surface; a resonant ring-shaped structure disposed over the first surface of the substrate, the resonant ring-shaped structure having dimensions selected to support at least one standing wave having more than one electric field maximum; and a ground plane disposed on the second surface of the substrate.

At 602, the method comprises providing a gas over the resonant ring-shaped structure at each of the electric field maxima. At 603, the method comprises causing an electric discharge at locations of each of the electric field maxima sufficient to strike a plasma from the gas.

While representative embodiments are disclosed herein, one of ordinary skill in the art appreciates that many variations that are in accordance with the present teachings are possible and remain within the scope of the appended claims. The invention therefore is not to be restricted except within the scope of the appended claims.

We claim:

1. A plasma generation device, comprising:
   a substrate having a first surface and a second surface;
   a resonant ring-shaped structure disposed over the first surface of the substrate, the resonant ring-shaped structure having dimensions selected to support at least one standing wave having more than one electric field maximum along a length of the resonant ring-shaped structure;
   a ground plane disposed on the second surface of the substrate; and
   an apparatus configured to provide a gas at locations of the electric field maxima,
   wherein when the resonant ring-shaped structure comprises a gap, electrodes on both sides of the gap are at equipotential.

2. The plasma generation device of claim 1, further comprising electrode extensions connected to the resonant ring-shaped structure at a location of each of the electric field maxima.

3. The plasma generation device of claim 1, wherein the resonant ring-shaped structure further comprises a microstrip transmission line.

4. The plasma generation device of claim 1, wherein the apparatus comprises a gas flow element configured to provide gas over each of the locations of the electric field maxima.

5. The plasma generation device of claim 1, further comprising:
   a plurality of structures, each of which is disposed adjacent the first surface to form respective enclosures that substantially enclose each of the locations of the electric field maxima.

6. The plasma generation device of claim 2, further comprising a plurality of structures, each of which is provided over a respective one of the electrode extensions, wherein each of the structures is configured to contain a plasma.

7. The plasma generation device of claim 2, the microstrip transmission line having a void between the resonant ring-shaped structure and the ground plane, wherein gas is provided in the void to generate the plasma.

8. The plasma generation device of claim 1, wherein the resonant ring-shaped structure is impedance matched at a resonance frequency to an impedance of a power source which provides microwave power to the resonant ring-shaped structure.

9. The plasma generation device of claim 2, wherein the electrode extensions are disposed over the first surface of the substrate.

10. The plasma generation device of claim 9, wherein each of the electric field maxima are located above a respective electrode extension.

11. The plasma generation device of claim 1, wherein the resonant ring-shaped structure comprises a first ring concentric with a second ring, and the first ring is coupled to the second ring.

12. The device of claim 11, wherein the first ring is a microstrip transmission line and the second ring is a microstrip transmission line.

13. A system, comprising:
   a power source;
   a gas feed line; and
   a plasma generation device, comprising:
   a substrate having a first surface and a second surface;
   a resonant ring-shaped structure disposed over the first surface of the substrate, the resonant ring-shaped structure having dimensions selected to support at least one standing wave having more than one electric field maximum along a circumference of the resonant ring-shaped structure;
   a ground plane disposed on the second surface of the substrate; and
   an apparatus configured to provide a gas at locations of the electric field maxima,
   wherein when the resonant ring-shaped structure comprises a gap, electrodes on both sides of the gap are at equipotential.

14. The system of claim 13, further comprising electrode extensions connected to the resonant ring-shaped structure at a location of each of the electric field maxima.

15. The system of claim 13, wherein the resonant ring-shaped structure further comprises one of a microstrip transmission line.

16. The system of claim 13, wherein the apparatus comprises a gas flow element configured to provide gas over each of the locations of the electric field maxima.

17. The system of claim 13, wherein the plasma generation device further comprises:
   a plurality of structures, each of which is disposed adjacent the first surface to form respective enclosures that substantially enclose each of the locations of the electric field maxima.

18. The system of claim 14, further comprising a plurality of structures, each of which is provided over a respective one of the electrode extensions, wherein each of the structures is configured to contain a plasma.

19. A method comprises:
   providing a gas to a plasma generation device, the plasma generation device comprising:
   a substrate having a first surface and a second surface;
   a resonant ring-shaped structure disposed over the first surface of the substrate, the resonant ring-shaped structure having dimensions selected to support at least one standing wave having more than one electric field maximum; and a ground plane disposed on the second surface of the substrate, generating an electric field having the electric field maxima, wherein when the resonant ring-shaped structure comprises a gap, electrodes on both sides of the gap are at equipotential such that is vertically oriented;

providing the gas over the resonant ring-shaped structure at each of the electric field maxima; and causing an electric discharge at locations of each of the electric field maxima sufficient to strike a plasma from the gas.

20. The method of claim 19, further comprising producing a vacuum ultraviolet (VUV) light from the plasma.

* * * * *